US007759842B2

(12) United States Patent
Song et al.

(10) Patent No.: US 7,759,842 B2

(45) Date of Patent: Jul. 20, 2010

(54) METHOD AND APPARATUS FOR AIR-COUPLED TRANSDUCER

(75) Inventors: Junho Song, North York (CA); Dale E. Chimenti, Ames, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 2 days.

(21) Appl. No.: 11/913,921

(22) PCT Filed: May 24, 2006

(86) PCT No.: PCT/US2006/020099

§ 371 (c)(1), (2), (4) Date: Apr. 28, 2008

(87) PCT Pub. No.: WO2006/127821

PCT Pub. Date: Nov. 30, 2006

(65) Prior Publication Data

US 2009/0158851 A1 Jun. 25, 2009

Related U.S. Application Data

(60) Provisional application No. 60/683,840, filed on May 24, 2005.

(51) Int. Cl.

*H01L 41/04* (2006.01)
*H01L 41/053* (2006.01)

(52) U.S. Cl. ...................................... 310/334; 310/800

(58) Field of Classification Search ................ 310/322, 310/334, 335, 369, 371, 326, 327, 800; 600/457, 600/459; 367/155, 157, 180; 381/114, 190

See application file for complete search history.

(56) References Cited

U.S. PATENT DOCUMENTS

| | | | |
|---|---|---|---|
| 5,287,331 | A | 2/1994 | Schindel et al. |
| 5,412,854 | A | 5/1995 | Lockwood et al. |
| 6,215,231 | B1 | 4/2001 | Newnham et al. |
| 6,775,388 | B1 | 8/2004 | Pompei |
| 2002/0087083 | A1 | 7/2002 | Nix et al. |
| 2002/0135273 | A1 | 9/2002 | Mauchamp et al. |

OTHER PUBLICATIONS

Search Report for co-pending PCT/US2006/20099 listing relevant art cited by the International Searching Authority.

*Primary Examiner*—Walter Benson
*Assistant Examiner*—Derek J Rosenau
(74) *Attorney, Agent, or Firm*—McKee, Voorhees & Sease, P.L.C.

(57) ABSTRACT

An air-coupled transducer includes a ultrasonic transducer body having a radiation end with a backing fixture at the radiation end. There is a flexible backplate conformingly fit to the backing fixture and a thin membrane (preferably a metallized polymer) conformingly fit to the flexible backplate. In one embodiment, the backing fixture is spherically curved and the flexible backplate is spherically curved. The flexible backplate is preferably patterned with pits or depressions.

20 Claims, 11 Drawing Sheets

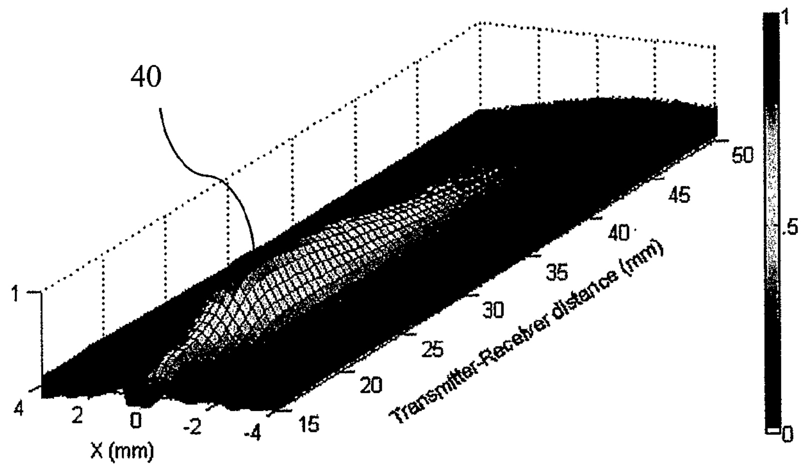
*Fig. 6A*
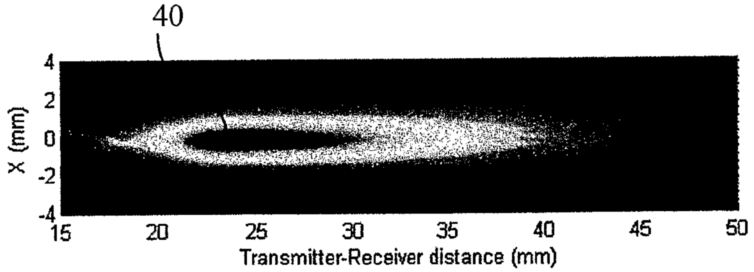
*Fig. 6B*
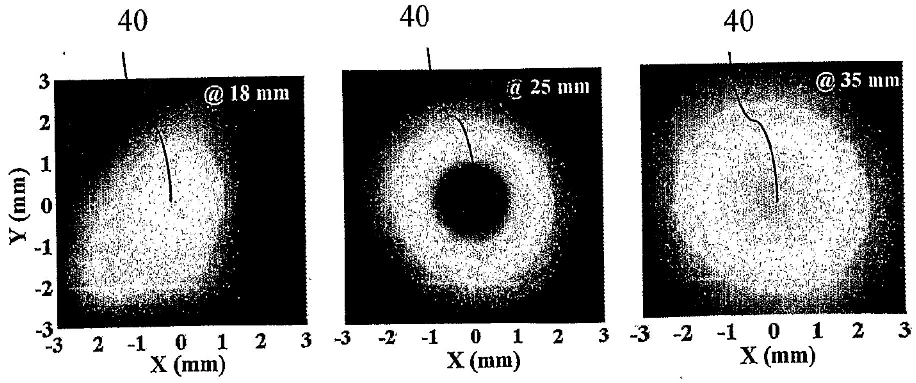
*Fig. 6C* *Fig. 6D* *Fig. 6E*

METHOD AND APPARATUS FOR AIR-COUPLED TRANSDUCER

CROSS-REFERENCE TO RELATED APPLICATIONS

This application is a conversion of and claims priority to U.S. Provisional Patent Application No. 60/683,840 filed May 24, 2005, which is herein incorporated by reference in its entirety.

GRANT REFERENCE

The work presented in this application was supported in part by a federal grant from the NASA Grant No. NAG102098. The government may have certain rights in this invention.

BACKGROUND OF THE INVENTION

More recently, non-contact inspection methods in nondestructive evaluation (NDE) have been receiving substantial attention compared with contact or liquid-coupled inspection methods. In particular, it is more practical and efficient to employ a non-contact inspection method if the article under inspection is wood, paper product, porous material, or hot metallic material. Unlike the contact inspection methods, the non-contact inspection methods use only gas or air as a coupling medium, so that there are no risks of contamination of the test article. In addition, the unique characteristics of air or gas as a coupling medium, such as the low sound wavespeed and minimal fluid loading, have encouraged the development of more non-contact inspection applications. Air-coupled ultrasound inspection applications have and continue to develop in various areas, including materials inspection[1-2], characterization[3-5], and ultrasonic imaging[6-7].

Most non-contact inspection methods employ either conventional piezoelectric (PZT) transducers or capacitive micromachined transducers. When a PZT transducer is used as a primary probe in air, it encounters very large acoustic impedance mismatch at the boundary between the piezoelectric element and the surrounding air or gas boundary. Because of this, impedance matching must be employed to improve the acoustic energy transmission in gaseous environments. Attempts to remedy this problem have been limited to success in narrow bandwidth operations. In addition, the application of a matching layer limits the overall bandwidth of the device.

Capacitive ultrasonic transducers consist of a thin metallized polymer membrane and conducting backplate. Compared to the piezoelectric transducers, the capacitive ultrasonic transducers have much smaller acoustic impedance mismatch between the membrane and air, owing to the very small mechanical impedance of a thin membrane. This arrangement makes a capacitive ultrasonic transducer ideal for coupling into air. The vibration of the membrane generates ultrasound in air. Receiving the vibrating sound signals is achieved using the same transducer as a reciprocal device.

Recently, microfabrication techniques have been used to fabricate capacitive air-coupled ultrasonic transducers[8-10]. Indeed, these techniques provide a means to fabricate the capacitive air-coupled transducers with low fabrication cost, high reliability, relatively high sensitivity, and reasonably wide bandwidth. Details of their operation and performance are reported elsewhere[8, 11-12].

With this high popularity and interest, additional effort is being invested in the development of transducer focusing for capacitive air-coupled transducers. A focused transducer can provide much higher transducer sensitivity than a non-focusing planar device. So far, this goal has largely eluded investigators, except for the use of mirrors[5], cylindrical focusing [13], and a Fresnel zone plate[14]. One group has attempted slightly to deform Si-wafers[15]. Mirrors provide only limited bandwidth and leave one dimension unfocused. Still, the Fresnel zone plate approach has inherent narrowband frequency response, image degradation by the generation of side lobes, and no specific design guidelines to decide radii of zone plates for ultrasound. Moreover, the cylindrical focusing technique relies heavily on surface conditions. Si-wafers have proven difficult to handle owing to the fragility and brittleness of the silicon. They also leave one dimension unfocused and suffer from bandwidth limitations. Because brittle silicon wafers have customarily been used to fabricate a focused ultrasonic transducer capacitor, little progress has been made in the development of a new backplate material. Therefore, the challenge still remains to fabricate a focused capacitive ultrasonic transducer.

BRIEF SUMMARY OF THE INVENTION

Therefore it is a primary object, feature, or advantage of the present invention to improve over the state of the art.

It is a further object, feature, or advantage of the present invention to provide an air-coupled transducer using a spherical radiating surface that does not require mirrors, zone plates or any similar external devise to effect focusing.

It is a still further object, feature, or advantage of the present invention is to provide an air-coupled transducer that provides for native focusing.

A still further object, feature, or advantage of the present invention is to provide an air-coupled transducer that provides no contact inspection, no impedance matching layer requirement, rapid inspection speed and wideband frequency response.

A further object, feature, or advantage of the present invention is to provide an air-coupled transducer having native focusing that provides higher signal amplitude, improved imaging capability and wide spatial bandwidth.

Another object, feature, or advantage of the present invention is to provide an air-coupled transducer that provides for focusing without aberrations.

Yet another object, feature, or advantage of the present invention to provide an air-coupled transducer that provides for focusing in two-dimensions.

A further object, feature, or advantage of the present invention to provide an air-coupled transducer that provides for spherical focusing.

It is a further object, feature, or advantage of the present invention to provide a diffraction-limited spherical focusing transducer.

Another object, feature, or advantage of the present invention is to provide a transducer that is relatively easy to fabricate.

Yet another object, feature, or advantage of the present invention is to provide a transducer that is relatively inexpensive.

A still further object, feature, or advantage of the present invention is to provide an air-coupled sensor for providing non-contact inspection.

Another object, feature, or advantage of the present invention is to provide a transducer with high signal amplitude and high spatial resolution.

Yet another object, feature, or advantage of the present invention is to provide a focusing transducer that does not use mirrors or interference plats.

A further object, feature, or advantage of the present invention is to provide a focusing transducer that does not sacrifice the efficiency of a micromachine backplate.

Another object, feature or advantage of the present invention is to provide a focusing transducer using a spherically deformed backplate and conformal polymer film shaped as a spherical radiator.

Yet another object, feature, or advantage of the present invention is to provide a focusing transducer using a flexible copper/polyamide backplate and a conformal metallized Mylar film.

A still further object, feature, or advantage of the present invention is to provide a focusing transducer that does not use a hard brittle material, such as silicon, for the transducer backplate.

Another object, feature, or advantage of the present invention is to provide a focusing transducer that does not have the limited sensitivity, limited bandwidth, and limited fabrication capability of prior art devices.

Yet another object, feature, or advantage of the present invention is to provide a method of manufacturing a spherical focusing transducer.

A still further object, feature, or advantage of the present invention is to provide a method for designing a spherical focusing transducer.

Another object, feature, or advantage of the present invention is to provide for determining relationships between performance characteristics and physical characteristics of a capacitive air-coupled transducer.

Yet another object, feature, or advantage of the present invention is to provide an ultrasound transducer having an integral membrane layer.

A further object, feature, or advantage of the present invention is to provide an ultrasound transducer with a membrane layer which is polarized through application of a high voltage.

One or more of these and/or other objects, features, or advantages of the present invention will become apparent from the specification and claims that follow.

According to one aspect of the present invention a non-contact ultrasound transducer is provided. The transducer includes a ultrasonic transducer body having a radiation end with a backing fixture at the radiation end. There is a flexible backplate conformingly fit to the backing fixture and a thin metalized polymer membrane conformingly fit to the flexible backplate. In one embodiment, the backing fixture is spherically curved and the flexible backplate is spherically curved. The flexible backplate is preferably patterned with pits or depressions.

According to another aspect of the present invention, a method of manufacturing a capacitive air-coupled transducer having a backing fixture is provided. The method includes conformingly fitting a flexible backplate to the backing fixture and conformingly fitting a thin metalized polymer membrane to the flexible backplate. The backing fixture and flexible backplate may be spherically shaped. The flexible backplate is fit over a warm spherical ball bearing to set the shape to a spherical shape.

BRIEF DESCRIPTION OF THE DRAWINGS

FIG. 6A-E are illustrations of measured sound pressure fields for the transducer.

DETAILED DESCRIPTION OF THE PREFERRED EMBODIMENT

Figure 1:
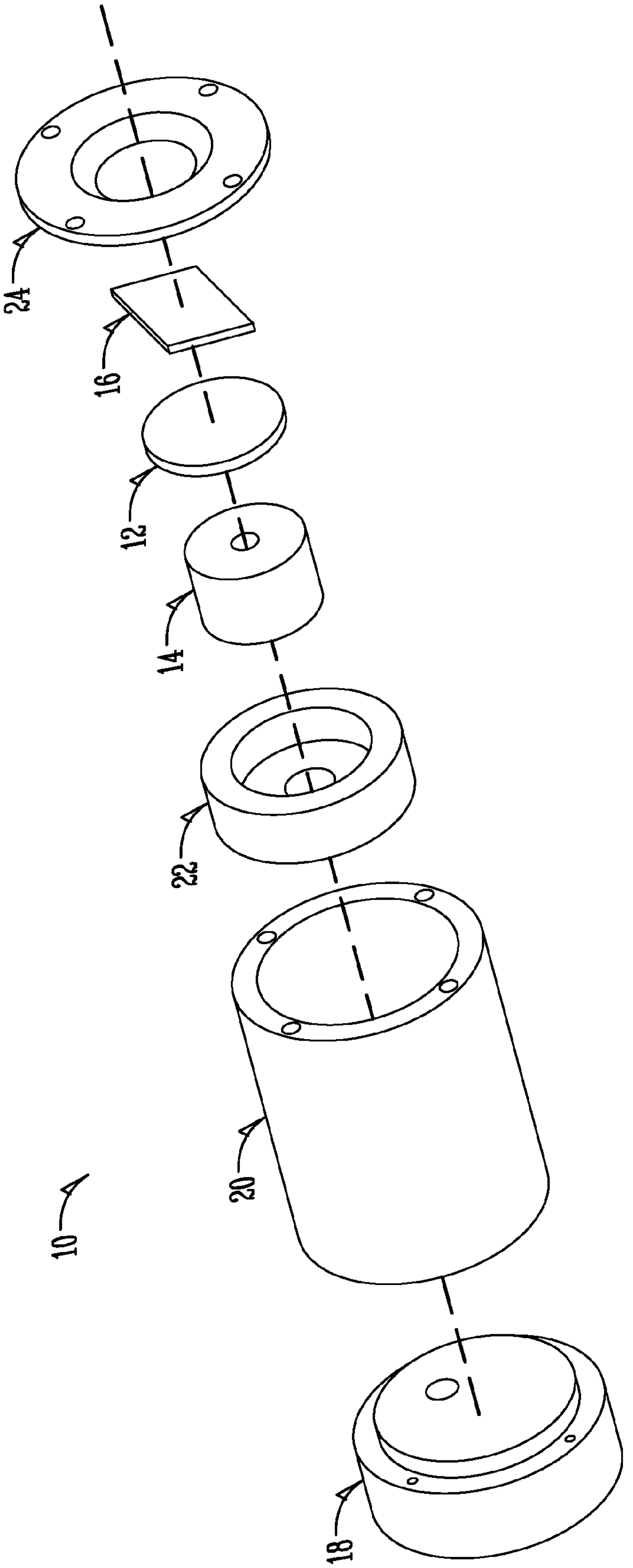
FIG. 1 is an isometric view of the transducer.

The present invention includes a number of aspects all of which have broad and far-reaching application. Although specific embodiments are described herein, the present invention is not to be limited to these specific embodiments. One aspect of the invention relates to the use of a flexible backplate in an air-coupled ultrasonic transducer. The flexible backplate allows it to conform to a number of different geometries, including, but not limited to a spherical shape.

Turning now to the drawings in which similar reference characters denote similar elements through the several views. Illustrated in FIGS. 1-10 is the combination of various views and in-use configurations of the transducer. The transducer being described with particularity herein.

Principles of Operation

FIG. 1 is an isometric view of the transducer. The process of generating and receiving ultrasound is very similar to the working principles of a condenser microphone. As shown in FIG. 1, an air coupled transducer 10 has a metallized polymer film 16 is suspended above a micromachined copper/polyimide backplate 12. For ultrasound generation, a dc bias $V_{dc}(t)$ is superimposed upon a transient voltage signal $V_{ac}(t)$ from a signal source. The superimposed voltage is applied between the backplate 12 and the grounded metalized surface 12 of the metalized polymer film 16. As a result, electrostatic force is generated and attracts the film toward the bottom of the pits. Based on the frequency content of the drive signal, the metalized polymer film 16 vibrates with certain amplitude. If the metalized film 16 vibrates near its mechanical resonance frequency, the maximum displacement will be generated, leading to a large ultrasonic signal. Conversely, receiving the vibrating sound signals is achieved using the same transducer as a reciprocal device. In the receiver mode, the received signals are modulated into minute capacitance changes, owing to the displacements of the film. The capacitance is converted into electrical signals by the transducer. For both a transmitter and receiver, a dc bias voltage 42 is always applied to charge the polymer film 16 so that the transducer is sensitive to very small changes in charge. The dc voltage 42 is highly determinative in the performance of a capacitive air-coupled transducer.

Transducer Construction and Backplate Fabrication Example

The transducer of the present invention is referred to generally as 10. FIG. 1 is an isometric view of the transducer. In FIG. 1, the component parts of the transducer 10 are shown. The transducer has a backplate 12, a backplate fixture 14, a metalized polymer film 16, a bottom case 18, an outer case 20, an insulator 22, and a top cover 24. The backplate 12 is conformably deformed and attached to the backplate fixture 14. The backplate fixture 14 is preferably spherical in shape so that the transducer functions like an ideal spherically focused piston radiator. The backplate fixture 14 is electrically connected to the center pin of a SubMiniature version A (SMA) connector, (not shown). The shield contact of the SMA connector is connected to the bottom case 18. An insulator 22 is added between the backplate fixture 14 and the outer case 20 to isolate the electrical connection between the backplate 12 and the ground. It is preferred that all the bottom case 18, outer case 20, backplate fixture 14, backplate 12 and top cover 24 be constructed of aluminum. A one-sided metallized polymer film 16 is positioned between the backplate 12 and top cover 24, with the metallized side facing the top cover 24. One type of film suitable for use is a commercially available polyethylene terephthalate (PET) polymer (Mylar) film with a 200 nm deposited aluminum coating. In the preferred embodiment, the metalized polymer film 16 is placed over the entire backplate 12, extending about 20% beyond the circumference of the pit-etched area.

Figure 2A:
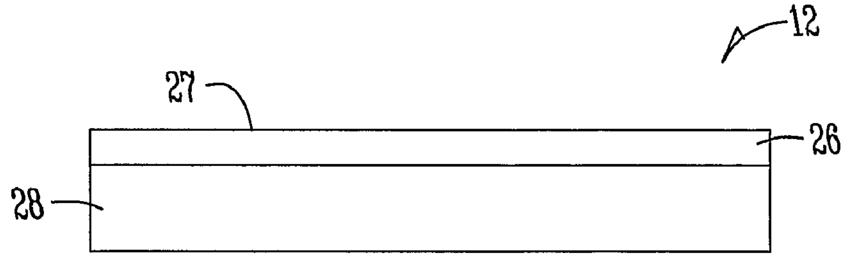
FIG. 2A-D are a schematic diagram of the backplate fabrication process.
Figure 2B:
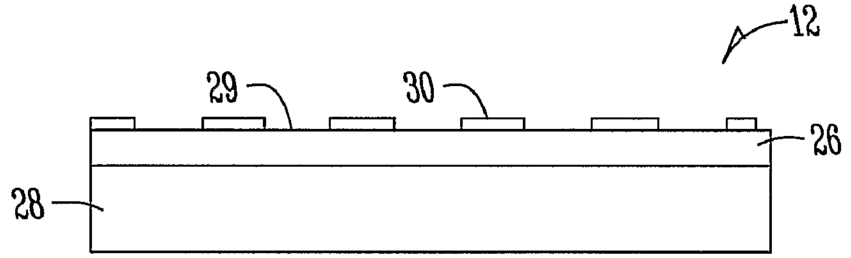
Figure 2C:
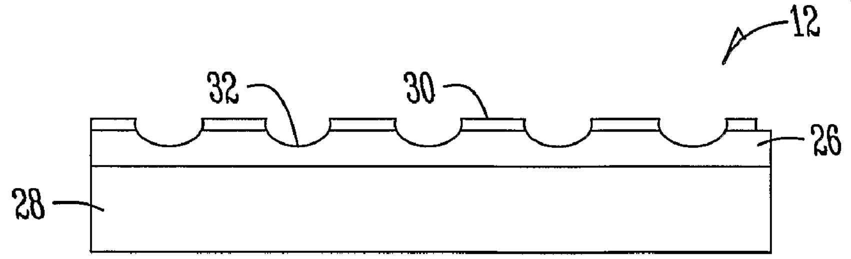
Figure 2D:
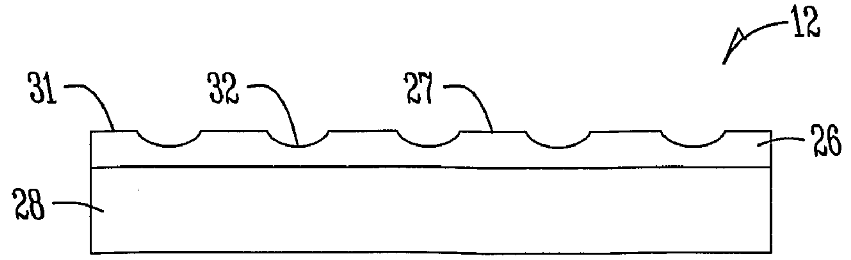
Figure 3A:
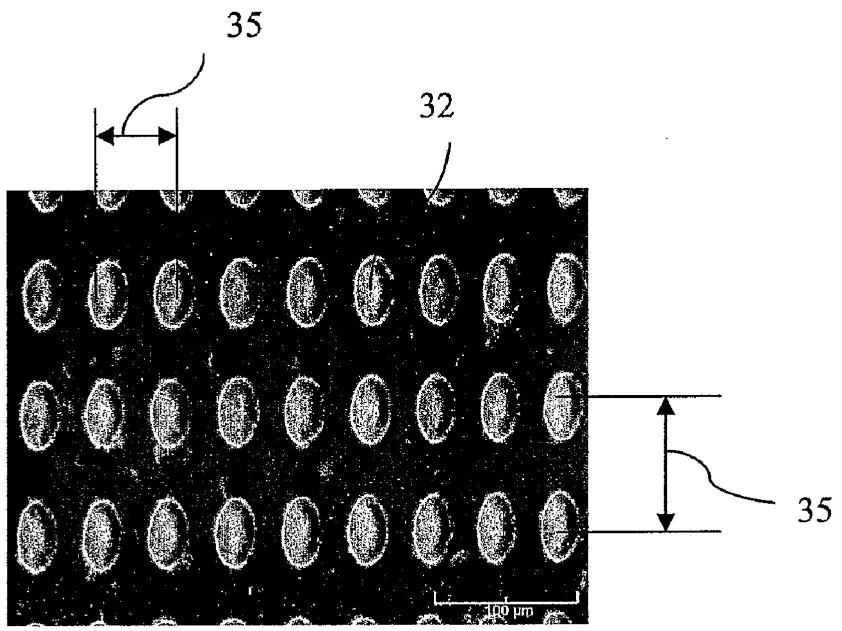
FIG. 3A-B are SEM images of a flexible copper/polyimide backplate and cross sectional SEM image of a flexible copper/polyimide backplate.
Figure 3B:
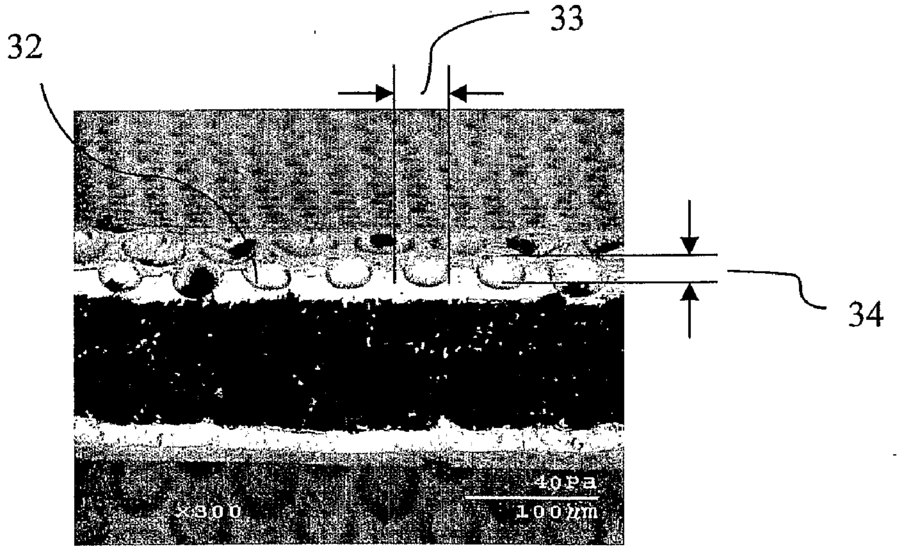

FIGS. 2A-2D illustrate the backplate fabrication process. Flexible copper(Cu)/polyimide(PI) is one type of material having optimum attributes for fabricating a backplate 12. The backplate 12 has a polyimide substrate 28 with a copper layer 26. The Cu/PI backplate 12 is a non-planar backplate 12 with curvature in two dimensions forming a spherically focused capacitive air-coupled transducer 10. The fabrication of a Cu/PI backplate 12 begins with cleaning the surface 27, as shown in FIG. 2A. In FIG. 2B, the circular patterns 29 are defined on the surface 27 of the copper layer 26 in a square grid by photoresist 30 using lithography and wet etching processes. After etching, the pits 32 form a well-defined bowl shape on the surface 27 of the backplate 12. One type of etchant used is a copper etchant (Ferric Chloride etchant) and the resulting pits 32, as best shown in FIG. 3B, are approximately 42 μm in diameter 33 with a 9-μm pit depth 34. FIGS. 3A and 3B show scanning electron microscope (SEM) images of a Cu/PI backplate 12 after the wet etching process, as shown in FIG. 2B. The patterns shown in FIG. 3A exhibit an 80-μm center-to-center spacing 35 between adjacent pits 32. The center-to-center spacing 35 corresponds to the distance between two adjacent pits 32 on a square grid, shown in FIG. 3A. The pit depth 34 represents the maximum distance from an unetched surface 31 to the bottom of a pit 34.

Figure 4:
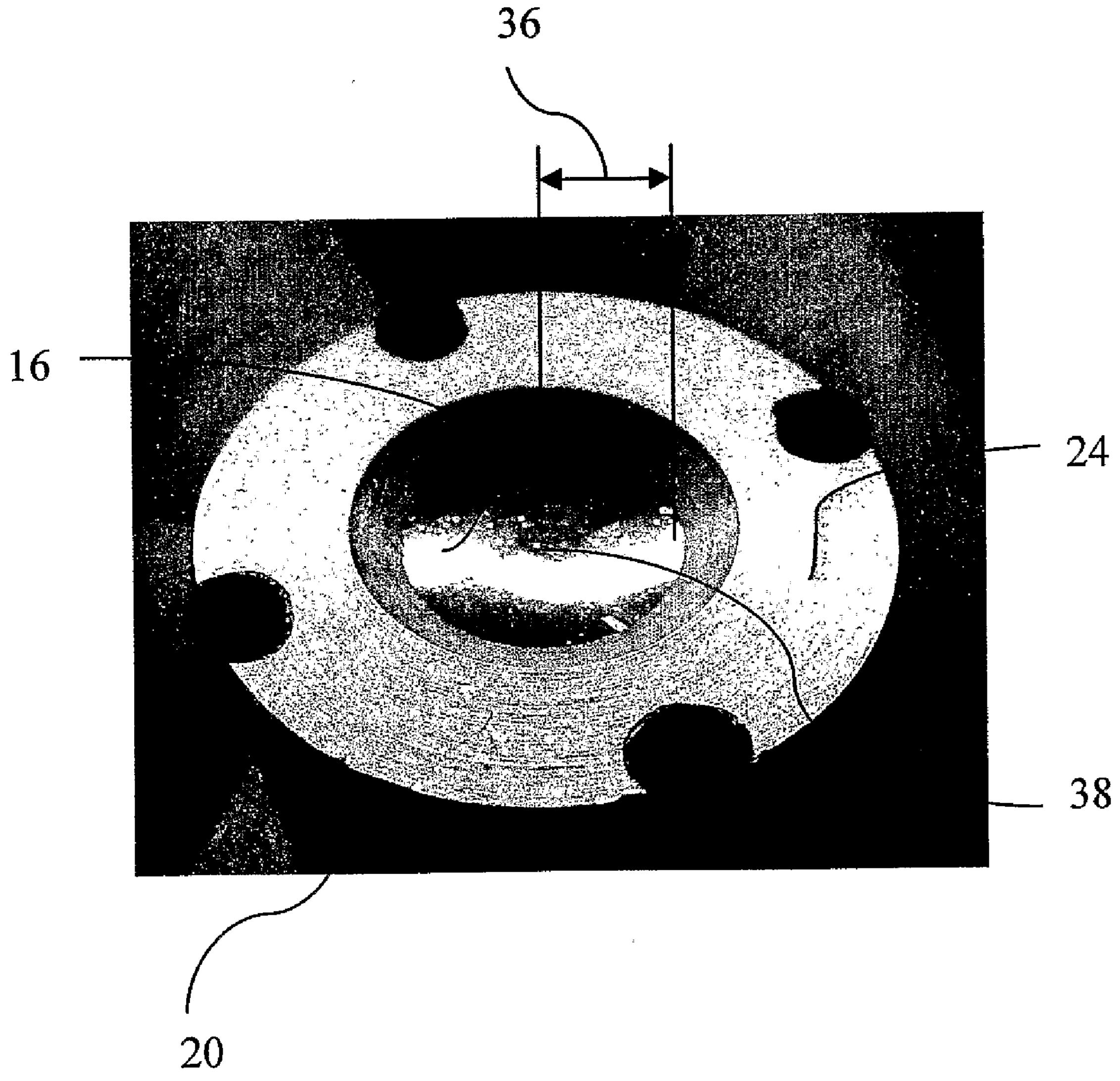
FIG. 4 is a photograph of the transducer.

FIG. 4 is a photograph of the spherically focused transducer. The Cu/polyimide backplate 12 is attached to conform to the spherically curved backplate fixture 14, whose preferred radius 36 is 5-mm having a focal length of 25.4 mm (1 inch). The metallized polymer film 16 is positioned on the spherically deformed backplate 12 to prevent wrinkles on the film 16. The film 16 is conformed to the spherical backplate 12, to prevent wrinkles. One method of preventing wrinkles in the film 16 is to stretch the film 16 over a stainless steel ball bearing where the radius of the ball bearing is approximately the same as the geometric focal length of a spherically deformed backplate 12. The stretching of the film 16 is done using a panel member having an aperture with the same radius of the bearing. The edge of the aperture is used as a boundary to; apply uniform hoop stress while stretching the film. To assist the film 16 in conforming to the spherical backplate 12, the ball bearing is heated to 35~40° C. Holding the film 16 in the stretched position for 20~30 seconds creates a half sphere, for fitting the spherical backplate 12. The film 16 is attached to the backplate 12 by applying 20~30 V dc biased to the transducer. This same process can be used to stretch and attach such films as 12.5 μm thick Kapton polyimide film.

Figure 5A:
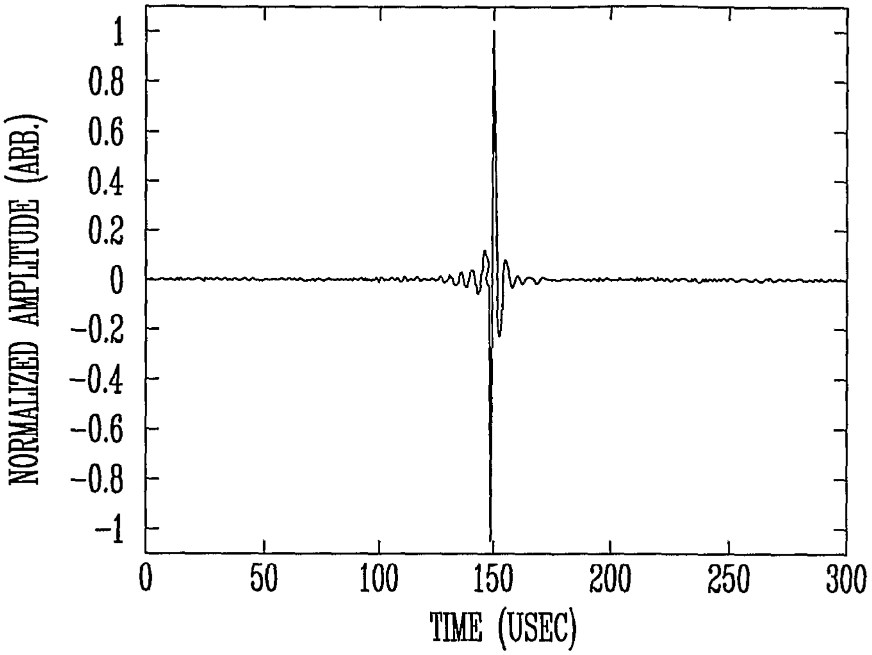
FIG. 5A-B are a graph illustration of amplitude response and corresponding frequency spectrum for the transducer.
Figure 5B:
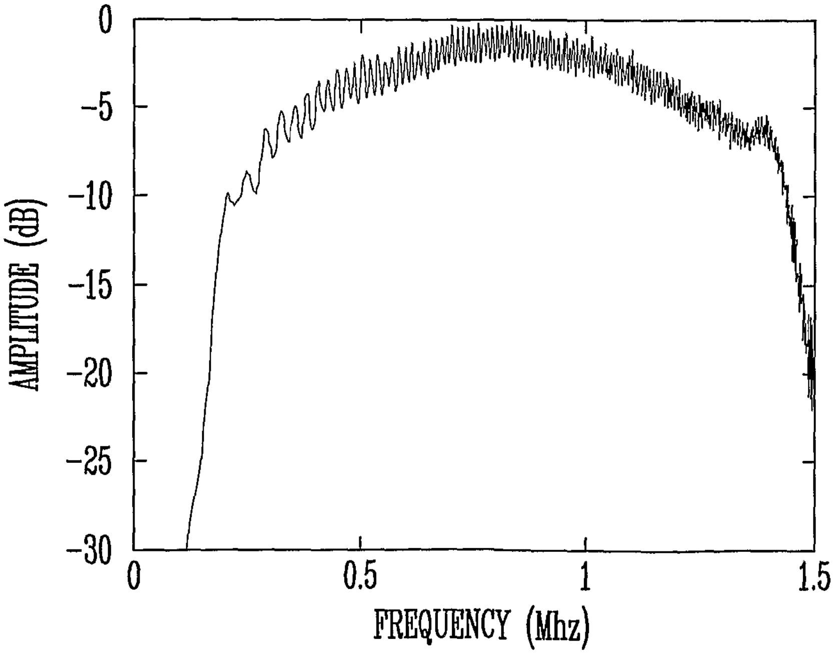

FIG. 5 is a graph illustration of amplitude response and corresponding frequency spectrum for the transducer. In FIG. 56, tests of the focused capacitive spherical transducer 10 show an ideal spherically focused piston transducer's beam diameter. The sound pressure fields are measured by scanning a 200-μm quasi-point receiver and recording its output voltage versus position. The focused capacitive spherical transducer 10 is driven at 250 $V_{p-p}$ using a broadband sweep signal. In particular, FIG. 5A shows a typical response of the focused transducer at the focal zone (z) of ~50.8 mm when the quasi point receiver is applied at 250 dc V. FIG. 5B shows a corresponding frequency spectrum. The frequency spectrum is centered at 805 kHz with 6-dB points and a bandwidth of approximately 800 kHz, measured at a lower and upper frequency of 400 and 1200 kHz, respectively.

FIG. 6A-E are illustrations of measured sound pressure fields for the transducer. Shown in FIGS. 6A and 6B are pressure fields for broadband excitation in the x-z plane at y=0 over an 8-mm×35-mm area with a spatial resolution of 100 μm, starting at z=15 mm. The origin of the coordinate system is located at the center 38 of the concave face of the spherical backplate 12 in the transducer 10, as best illustrated in FIG. 4. Darker regions near the center represent stronger sound pressure fields with the adjacent lying lighter regions representing a weakened sound pressure field. The pressure field 40 shows a starting and ending of the focal zone with −6 dB points located at 19.1 mm and 32.2 mm. FIG. 6C-E shows the sound pressure fields 40 in the cross-sectional regions (x-y plane) at the focal zone over 6 mm×6 mm area, respectively. The beam diameter is approximately 2.1 mm at z=18 mm, z=25 mm and z=35 mm respectively for FIG. 6C-E when the transducer is driven by a broadband signal. FIG. 6C shows the maximum amplitude for the measured sound field occurring at ~z=25 mm. The maximum amplitude fades in signal strength as the focal length approaches ~z=18 mm and z=35 mm, as best illustrated by FIGS. 6C and 6E, respectively.

Figure 7A:
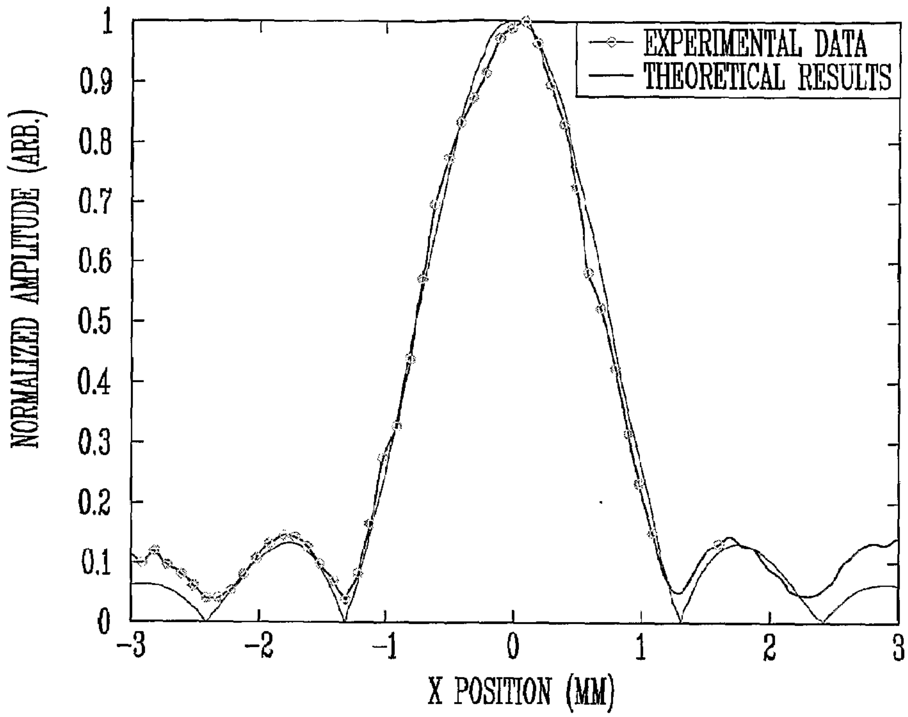
FIG. 7A-B are a graph illustration of the cross sections of the focal region of the measured and theoretical sound pressure fields for the transducer.
Figure 7B:
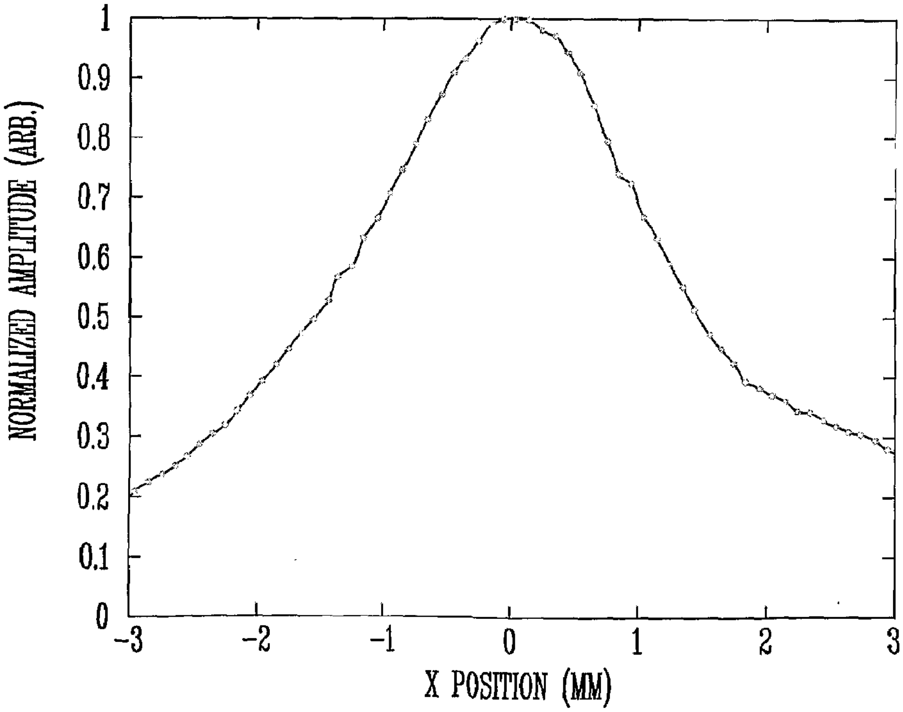

FIG. 7A-7B are a graph illustration of the cross sections of the focal region of the measured and theoretical sound pressure fields for the transducer. In these graphs, the liner scan measurements and theoretical predictions are shown along the x-axis with a spatial resolution of 0.1 mm for 800 kHz tone burst using broadband excitation. The performance of the transducer 10 is compared to the theoretical prediction using a modified Rayleigh-Sommelfield model[16]. The modified Rayleigh-Sommerfield model shows that the pressure, p, in a fluid for a circular piston transducer of radius, a, having uniform piston velocity $v_0$ is:

$$p(R_0,y,\omega)=-i\omega\rho v_0 a^2[\exp(ikR_0)/R_0][J_1(ka\sin\theta)/ka\sin\theta] \quad (1)$$

where ρ is the medium density, $R_0$ is the focal length and k is the wavenumber. The measurements are obtained at the focal zone for each excitation signal found in the x-z plane scan. The full width at half maximum (FWHM) value is measured approximately 1.38 mm and its theoretical predication is 1.37 mm. The transducer 10 is driven by a broadband excitation signal, the measured FWHM value is approximately 2.7 mm at the focal point, z=24.9 mm. Thus, beam diameters of the focused transducer are 1.38 mm and 2.7 mm using an 800 kHz tone burst and broadband excitation. And, the transducer 10 exhibits sound pressures nearly identical to the ideal spherically focused piston transducer's beam diameter.

Figure 8A:
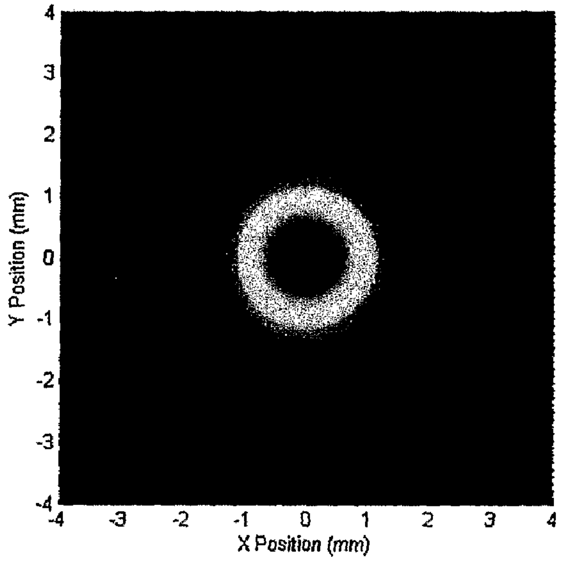
FIG. 8A-B are illustrations of measured signal intensity and theoretical predications for the transducer.
Figure 8B:
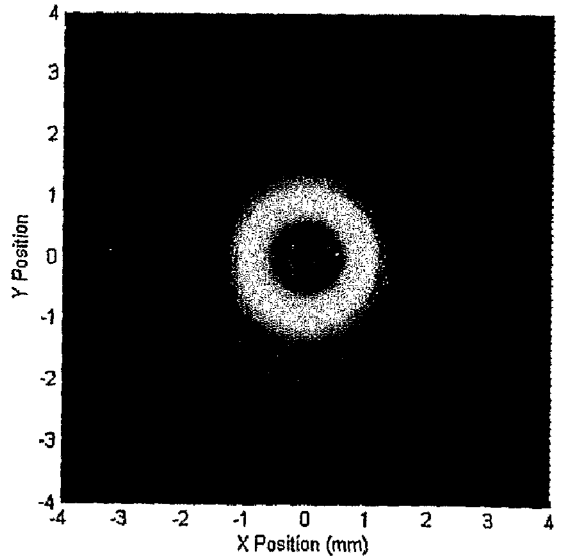

FIG. 8A-B are illustrations of measured signal intensity and theoretical predications for the transducer. FIGS. 8A and 8B show a comparison between the Airy disks of measured signal intensity and theoretical predications for an 800 kHz tone burst. FIG. 8A illustrates the measured signal intensity, where the adjacent rings extending out from the center or origin represent a decease in signal intensity. FIG. 8B illustrates the theoretical predications calculated using a modified Rayleigh-Sommerfield model. Comparison of FIG. 8A with FIG. 8B reveals little to no aberrations between the two plots.

Thus, inducer 10 of the present invention is proof of a simple, yet reliable, fabrication method to produce the natively focused micromachined capacitive air-coupled spherical ultrasonic transducer. By selecting, producing and integrating a flexible substrate with a curved backplate 12 fabrication into the transducer 10 solves the most difficult and unsolved problem plaquing transducers, especially air sound generation and detection. Moreover, because the transducer 10 is natively focused, the transducer 10 eliminates the need for auxiliary devices, such as acoustic mirrors, to focus air-coupled acoustic beams, and still behaves identical to an ideal spherically focused piston radiator. The transducer 10 exhibits higher signal amplitude, wider bandwidth and better spatial resolution and significantly improves air-coupled ultrasonic nondestructive evaluation and imaging applications.

Figure 9A:
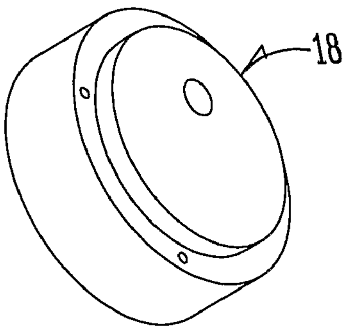
FIG. 9A-E are the isometric views of the bottom case, backplate fixture, outer case, insulator, and top cover for the transducer according to one embodiment of the present invention.
Figure 9B:
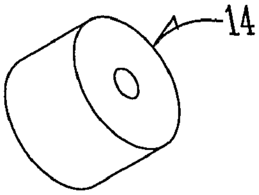
Figure 9C:
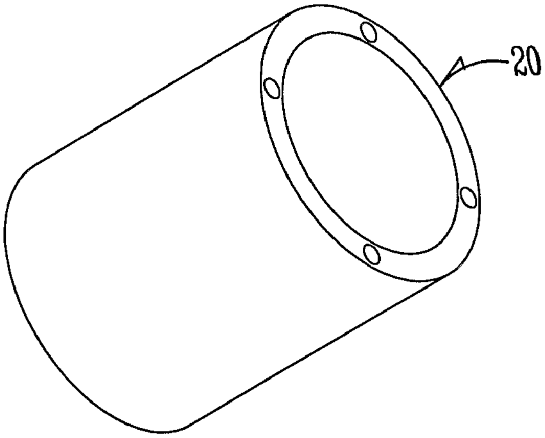
Figure 9D:
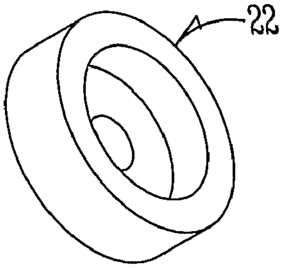
Figure 9E:
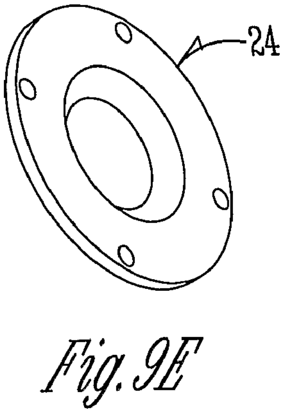

FIG. 9A-E are the isometric views of the bottom case, backplate fixture, outer case, insulator, and top cover for the transducer according to one embodiment of the present invention. FIG. 9A-E illustrate the design for a 10 mm spherically focused capacitive air-coupled transducer having a 25.4 mm geometric focal length and active angular sensitivity of ±15° with respect to the normal axis and according to one embodiment. The 10 mm diameter transducer is applicable to almost all phase-match angles for common engineering materials, including metals, plastics, carbon and glass fiber composites. In FIG. 9A the bottom case 18 is illustrated, as best shown in FIG. 1. The bottom case 18 is preferably manufactured by machining out of aluminum stock. Dimensions, clearances, feature parts and tolerances for manufacturing are noted in each engineering drawing. FIG. 9B is the backplate fixture 14, as best shown in FIG. 1. The backplate fixture 14 is also preferably manufactured from aluminum stock, having a high degree of machinability. The outer case 20 is shown in FIG. 9C. The outer case 20 is machined from aluminum stock. The outer case 20 is also shown in FIG. 1. FIG. 9D is an engineering drawing for the insulator. The insulator is preferably constructed of Delrin and is also shown in FIG. 12. FIG. 9E shows the top cover 24 of the insulator 10 device. The top cover 24 is shown in FIG. 1, as well. The top cover 24 is preferably manufactured from aluminum stock and has an aperture with a radius 36 of 1 inch.

Figure 10A:
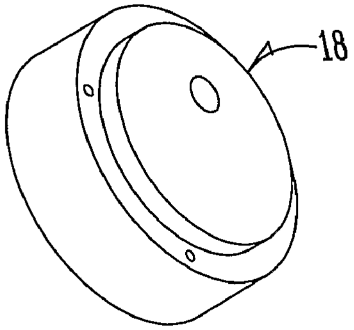
FIG. 10A-E are the isometric views of the bottom case, backplate fixture, outer case, insulator, and top cover for the transducer according to another embodiment of the present invention.
Figure 10B:
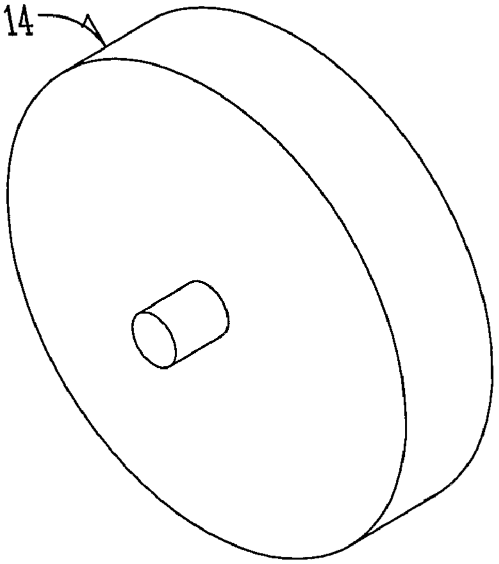
Figure 10C:
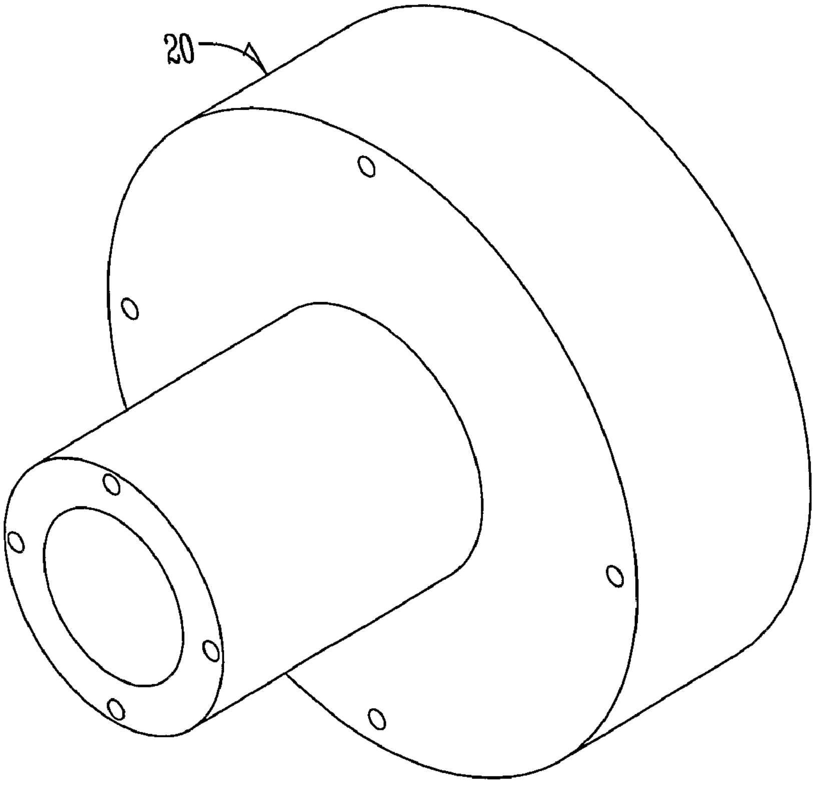
Figure 10D:
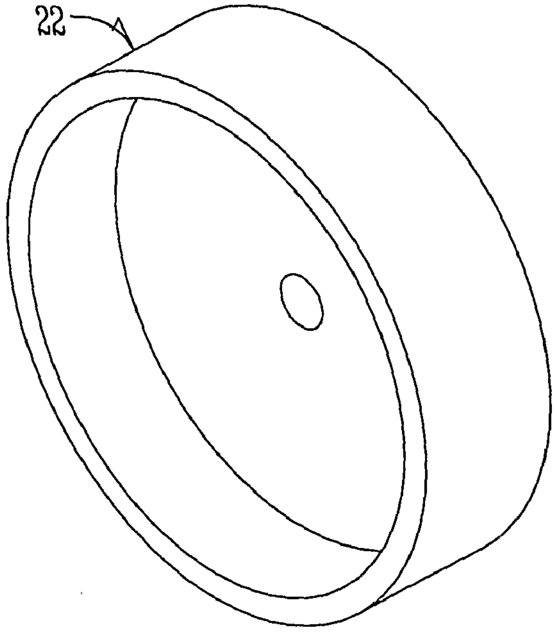
Figure 10E:
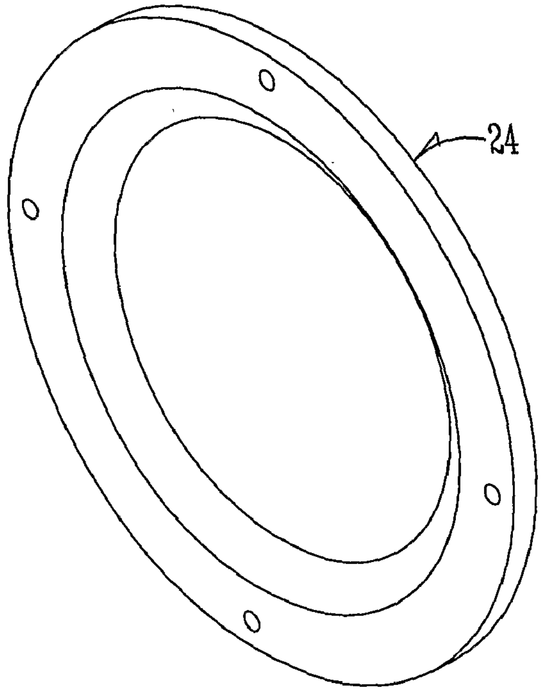

FIG. 10A-E are the isometric views of the bottom case, backplate fixture, outer case, insulator, and top cover for the transducer according to one embodiment of the present invention. FIG. 10A-E illustrate the design for a 50 mm spherically focused capacitive air-coupled transducer having a 50.8 mm geometric focal length and active angular sensitivity of ±33° with respect to the normal axis and, according to another embodiment. The 50 mm diameter transducer is applicable to almost all phase-match angles for common engineering materials, including metals, plastics, carbon and glass fiber composites. In FIG. 101A the bottom case 18 is illustrated, as best shown in FIG. 1. The bottom case 18 is preferably manufactured by machining out of aluminum stock. Dimensions, clearances, feature parts and tolerances for manufacturing are noted in each engineering drawing. FIG. 10B is the backplate fixture 14, as best shown in FIG. 1. The backplate fixture 14 is also preferably manufactured from aluminum stock, having a high degree of machinability. The outer case 20 is shown in FIG. 10C. The outer case 20 is machined from aluminum stock. The outer case 20 is also shown in FIG. 1. FIG. 10D is an engineering drawing for the insulator 22. The insulator is preferably constructed of Delrin and is also shown in FIG. 1. FIG. 10E shows the top cover 24 of the transducer 10 device. The top cover 24 is shown in FIG. 1, as well. The top cover 24 is preferably manufactured from aluminum stock and has an aperture with a radius 36 of 2 inches.

Altering Performance Characteristics

Various factors determine the performance characteristics of a capacitive air-coupled transducer. Overall, both surface geometries of a backplate 12 and transducer's operating conditions strongly affect performance characteristics. These include pit diameter 33, center-to-center spacing 35, pit depth 34, bias voltage, and nature of a metalized polymer film 16.

Based on the calibration results, the sensitivity of the capacitive transducer 10 is improved by utilizing a smaller pit diameter 33, wider center-to-center spacing 35, and increased pit depths 34 on the backplate geometry 12, as best illustrated in FIG. 3A-B. In particular, the strongest sound pressure amplitude in air is measured when center-to-center spacing 35 is equal to "4*(pit diameter)". This same result holds true for both 40 μm and 80 μm pit diameters 33. Cross couplings between the pits 32 is a strong consideration if the center to center spacing 35 of the pits 32 is too close together. For example, the sensitivity of a backplate 12 with 40 μm pit diameter 33 and 60 μm center-to-center spacing 35 has a 30% lower sensitivity than a backplate 12 with 40 μm pit diameter 33 and 160 μm center-to-center spacing 35. This finding is evidence of the cross coupling effect when 80 μm pit diameter 33 is employed in the backplate design 12. Comparison between 120 μm and 320 μm center-to-center spacings 35 shows that the sensitivity decreases approximately 90% when the center-to-center spacing 35 changes from 320 μm to 120 μm. Accordingly, given a pit diameter 33, the sensitivity of a capacitive transducer 10 is maximized in part by employing an optimal center-to-center spacing 35 which is 4*(pit diameter). Cross coupling effects increase as pit diameter 33 is increased.

When a backplate 12 has deeper pits 32 rather than shallower pits 32, the sensitivity is much higher than employing shallower pits 32 on a backplate 12 design. When pit depth 34 varies from 5.5 μm to 11.7 μm, the sensitivity increases approximately two fold. Thus, there exists an optimal point where the sensitivity is maximized.

Sensitivity is also increased by either applying high dc bias to the transducer 10 or utilizing a thinner metalized polymer film 16. In particular, the sensitivity of a capacitive air-coupled transducer 10 increases as the applied bias voltage increases, where the applied bias is higher than the critical voltage and lower than the breakdown voltage of the metallized polymer film 16. For example, the 6 μm thick Mylar film 16 with a 20 nm thick aluminum layer on one side has a critical voltage around 100 V. The critical voltage is highly dependent on the nature of a metalized polymer film 16, such as thickness and chemical structure of the polymer layer.

A thinner metallized polymer film 16 improves the sensitivity of a capacitive transducer 10. The resulting effect of thinning the metallized polymer film 16 correlates with the resulting effect of applying high dc bias to the transducers 10. The correlation exists because the polymer film 16 over the pits 32 is vibrated by a high electric field, which is approximately inversely proportional to the thickness of the polymer layer 16. At the same dc bias, a polymer film 16 with higher dielectric constant generates better sensitivity than a polymer film 16 with lower dielectric constant. For example, 0.5 mil Kapton film 16 exhibits sensitivities 10% higher than the 0.5 mil PET film 16. Similarly, the 0.3 mil Kapton film 16 shows 20% higher sensitivity than a 0.25 mil PET's film 16. The resulting sensitivities related to film thickness incrementally reduces the electrostatic force by 3.3% while the difference in dielectric constant exhibits a 25% increase in electrostatic force. Thus, a thinner polymer layer with high dielectric constant generates higher sensitivity. In addition to these previously noted advantages, the present invention using the Mylar film 16 can be polarized with a high voltage, and when this external voltage is removed a permanent bias voltage remains on the film 16. This residual bias eliminates the need for an external biasing source during operation of the transducer 10 and allows the transducer 10 to be applied in just the same manner, from an electronic standpoint, as a conventional piezoelectric transducer 12. This development makes the capacitive transducer easier and more convenient to use.

The frequency characteristics of the capacitive air-coupled transducer 10 are controlled in part by the surface geometries of a backplate 12 and transducer's operating conditions, as previously stated. Moreover, the resonant frequency of a capacitive air-coupled transducer 10 significantly increases when a small pit diameter 33, shallow pit 34, high bias voltage or thin metalized polymer film 16 are used in the backplate 12 design. Other considerations, such as center-to-center spacing 35 of the pits 32, are not as influential to the resonant frequency as much as other factors. Variation of center-to-center spacing 35 from 80 μm to 200 μm for a backplate 12 with 40 μm pit diameter 33, the variation in the resonant frequency is approximately ±23.7 kHz. Variations of approximately ±12.7 kHz result from use of the backplate 12 employing 80 μm pit diameters 33 and varied center-to-center spacing 35 from 120 μm to 400 μm.

A backplate 12 with shallow pit depths 34, exhibited higher resonant frequencies, such that the resonant frequency increases linearly as pit depth 34 decreases. More notably, for pit depths 34 less than 15 μm, the resonant frequency of a capacitive air-coupled transducer 10 is inversely increasing with respect to pit depth 34.

Similar to center-to-center spacing 35, bias voltage does not significantly change the resonant frequency. The lowest resonant frequency results when the applied bias voltage is at the critical voltage, 100 V. Except for bias voltages around 100 V, other voltages in the range between 0 and 300 V produce a constant resonant frequency. At 0 V, the resonant frequency is approximately the same as at 300 V.

Utilizing a thin metalized polymer film 16, the resonant frequency of a capacitive air-coupled transducer 10 is increased. Particularly, using a 0.25 mil PET film 16 instead of a 0.5 mil PET film 16 results in 40 kHz increase in the resonant frequency. Further, increases in resonant frequency are increased for a Kapton film 16. The resonant frequency of a 0.3 mil Kapton film is 180 kHz higher than the 0.5 mil Kapton film 16.

Similar to the resulting resonant frequency, the bandwidth of a capacitive air-coupled transducer 10 increases with larger pit diameters 33, shallower pits 34, high bias voltage, and thinner polymer films 16. However, center-to-center spacing 35 does not significantly change the bandwidth. As pit depth 34 increases, the bandwidth significantly decreases. When pit depth 34 is 5.5 μm on a copper/polyimide backplate 12, the bandwidth increases approximately 300 kHz as compared to the 11.7 μm deep pits 34 used in the backplate 12 design. In addition to shallow pits 32, the pits with large diameter 33 also increases the bandwidth. The order of the variations is not so significant to be considered as minor variations in design. In fact, employing the thin metalized polymer film 16 attains a wider bandwidth. Moreover, a polymer film 16 with a high dielectric constant exhibits a narrower bandwidth than a polymer film 16 with low dielectric constant.

Other Options and Variations

The present invention contemplates numerous other options in the design and use of air-coupled non-contact sensors. It is to be understood, for example, that the air-coupled non-contact sensor need not be spherical but can be of other shapes, including conical, cylindrical, or otherwise shaped depending upon the particular application. It is also to be understood that the flexible backplate can made of other materials, including, but not limited to, the types of materials used in making flexible circuit boards. Also, the present invention contemplates variations in the type of polymer membrane used. Although it is preferred that the membrane be metallized or otherwise have a conductive layer, the membrane need not. Also, the present invention contemplates that an integral thin membrane can be used over the flexible backplate. Where an integral thin membrane is used, there is no need to apply a polymer film such as Mylar and the integral thin membrane would not be susceptible to dust particles or damage.

These and other options, variations, are all within the spirit and scope of the invention.

REFERENCES

All the references as listed below are herein incorporated by reference in their entirety.

REFERENCES

[1] R. Stoessel, N. Krohn, K. Pflediderer, and G. Busse, *Air-coupled ultrasound inspection of various material*, Ultrasonics, 40, 159-163, 2002.

[2] M. Castaings, P. Cawley, R. Farlow, G. Hayward, *Single sided inspection of composite material using air-coupled ultrasound*, J. Nondestr. Eval., 17, 37-45, 1998.

[3] E. Blomme, D. Bulcaen, F. Declercq, *Air-coupled ultrasonic NDE: experiments in the frequency range* 750 *kHz*-2 *MHz*, NDT&E Int., 35, 417-426 (2002)

[4] A. Safaeinili, O. I. Loblds, D. E. Chimenti, *Air-coupled ultrasonic estimation of viscoelastic stiffnesses in plates*, IEEE Trans. Ultrason., Ferroelect., Freq. Contr., 43, 1171-1180, 1995.

[5] S. D. Holland, S. V. Telles, and D. E. Chimenti, *Air-coupled, focused ultrasonic dispersion spectrum reconstruction in plates*, J. Acoust. Soc. Am., 115, 2866-2872 (2004).

[6] S. D. Holland, D. E. Chimenti, *Air-coupled acoustic imaging with zero-group-velocity lamb modes*, Appl. Phys. Lett., 83, 2704-2706 (2003).

[7] Neild, D. A. Hutchins, D. R. Billson, *Imaging using air-coupled polymer-membrane capacitive ultrasonic arrays*, Ultrasonics, 42, 859 (2004).

[8] D. W. Schindel, D. A. Hutchins, *The design and characterization of Micromachined Air-coupled Capacitance Transducers*, IEEE Trans. Ultrason., Ferroelect., Freq. Contr., 42(1), 42-50 (1995).

[9] I. Ladabaum, B. T. Khuri-Yakub, D. Spoliansky, *Micromachined ultrasonic transducers:* 11.4 *MHz transmission in air and more*, Appl. Phys. Lett, 68(1), 7-9, 1996.

[10] M. I. Haller and B. T. Khuri-Yakub, *A surface micromachined electrostatic ultrasonic air transducer*, IEEE Trans. Ultrason. Ferroelect. and Freq. Cont., 43(1), 1-6, 1996.

[11] I. Ladabaum, X. Jin, H. T. Soh, A. Atalar and B. T. Khuri-Yakub, *Surface Micromachined Capacitive Ultrasonic Transducers*, IEEE Trans. Ultrason., Ferroelect., Freq. Contr., 45(3), 678-690 (1998).

[12] A. S. Ergun, A. Atalar, B. Temlkuran, E. Ozbay, *A sensitive detection method for capacitive ultrasonic transducers*, Appl. Phys. Lett., 72(23), 2957-2959 (1998).

[13] T. J. Robertson, D. A. Hutchins and D. R. Billson, *Capacitive air-coupled cylindrical transducers for ultrasonic imaging applications*, Meas. Sci. and Tech., 13, 758-769 (2002)

[14] D. W. Schindel, A. G. Bashford, D. A. Hutchins, *Focusing of ultrasonic waves in air using a micromachined Fresnel zone-plate*, Ultrasonics, 35, 275 (1997).

[15] K. A. Wong and S. Panda, and I. Ladabaum, *Curved Micromachined ultrasonic transducer*, Proc. IEEE Ultrason. Symp., 1, 572-576 (2003).

[16] L. W. Schmerr, Jr., *Fundamentals of ultrasonic nondestructive evaluation—A modeling Approach*, Plenum Press, 181-197, New York, N.Y., 1998.

[17] H. Carr and C. Wykes, *The performance of capacitive transducers*, Ultrasonics, 31, 13-20, 1993.

What is claimed is:

1. A non-contact ultrasound transducer, comprising:

a ultrasonic transducer body having a radiation end;

a backing fixture at the radiation end;

a electrically conductive flexible backplate conformingly fit to the backing fixture;

a thin metalized polymer membrane conformingly fit to the flexible backplate; and wherein the electrically conductive flexible backplate being positioned between the backing fixture and the thin metalized polymer membrane.

2. The non-contact ultrasound transducer of claim 1 wherein the backing fixture is spherically curved and the electrically conductive flexible backplate is spherically curved.

3. The non-contact ultrasound transducer of claim 1 wherein the thin metalized polymer membrane comprises a mylar film covered by an aluminum metallization.

4. The non-contact ultrasound transducer of claim 1 wherein the flexible backplate comprises a copper layer and a polymide foil.

5. The non-contact ultrasound transducer of claim 1 wherein the electrically conductive flexible backplate is patterned with depressions.

6. The non-contact ultrasound transducer of claim 5 wherein the depressions are circular depressions.

7. The non-contact ultrasound transducer of claim 5 wherein the depressions are fabricated by wet etching.

8. The non-contact ultrasound transducer of claim 5 wherein the depressions are sized and spaced to increase signal amplitude.

9. The non-contact ultrasound transducer of claim 5 wherein the depressions are pits having a center-to-center spacing, a pit diameter, and a pit depth.

10. The non-contact ultrasound transducer of claim 9 wherein the center-to-center spacing is approximately equal to four times the pit diameter to thereby improve sensitivity of the non-contact ultrasound transducer.

11. The non-contact ultrasound transducer of claim 1 wherein the backplate is adhered to the backing fixture.

12. The non-contact ultrasound transducer of claim 1 wherein the non-contact ultrasound transducer is focused without use of mirrors or zone plates.

13. A non-contact ultrasound transducer, comprising:

a ultrasonic transducer body having a radiation end;

a backing fixture at the radiation end;

a electrically conductive flexible backplate conformingly fit to the backing fixture;

a polymer membrane conformingly fit to the electrically conductive flexible backplate; and wherein the electrically conductive flexible backplate being positioned between the backing fixture and the polymer membrane.

14. A non-contact ultrasound transducer, comprising:

a ultrasonic transducer body having a radiation end; a backing fixture at the radiation end;

a electrically conductive flexible backplate conformingly fit to the backing fixture;

a membrane operatively connected fit to the electrically conductive flexible backplate; and wherein the electrically conductive flexible backplate being positioned between the backing fixture and the membrane.

15. The non-contact ultrasound transducer of claim 14 wherein the membrane is a polymer membrane.

16. The non-contact ultrasound transducer of claim 14 wherein the membrane is an integral membrane.

17. The non-contact ultrasound transducer of claim 14 wherein the membrane is polarized through application of a high voltage.

18. The non-contact ultrasound transducer of claim 17 wherein the polarized membrane retains a permanent bias voltage on the membrane after the external voltage is removed.

19. The non-contact ultrasound transducer of claim 18 wherein the permanent bias eliminates the need for an external bias source during operation of the transducer thereby assisting in the ease and convenience of use of the transducer.

20. A non-contact ultrasound transducer, comprising:

a ultrasonic transducer body having a radiation end;

a backing fixture at the radiation end;

a electrically conductive flexible backplate conformingly fit to the backing fixture;

a thin metallized polymer membrane conformingly fit to the electrically conductive flexible backplate;

the electrically conductive flexible backplate further comprising a first and a second adjoining adjacent layers, the first layer having a top surface; a pattern on the top surface, and a plurality of adjacently spaced pits on the surface formed using the pattern; and wherein the electrically conductive flexible backplate being positioned between the backing fixture and the thin metalized polymer membrane.

* * * * *